United States Patent
Wang et al.

(10) Patent No.: US 10,574,152 B2
(45) Date of Patent: Feb. 25, 2020

(54) USE OF ADDITIONAL RESISTANCES AND CAPACITANCES BY OPTIMIZATION TO SOLVE GATE VOLTAGE OSCILLATION DURING SHORT CIRCUIT TURN-OFF PROTECTION FOR A SEMICONDUCTOR SWITCH

(71) Applicant: Toyota Motor Engineering & Manufacturing North America, Inc., Erlanger, KY (US)

(72) Inventors: Chi-Ming Wang, Ann Arbor, MI (US); Ercan M. Dede, Ann Arbor, MI (US); George C. Bucsan, Belleville, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 39 days.

(21) Appl. No.: 15/682,392

(22) Filed: Aug. 21, 2017

(65) Prior Publication Data
US 2019/0058413 A1    Feb. 21, 2019

(51) Int. Cl.
*H02M 7/06* (2006.01)
*H02M 1/32* (2007.01)
(Continued)

(52) U.S. Cl.
CPC ............ *H02M 7/062* (2013.01); *H02M 1/088* (2013.01); *H02M 1/32* (2013.01); *H02M 1/34* (2013.01);
(Continued)

(58) Field of Classification Search
CPC . H02M 7/062; H02M 1/32; H02M 2001/0054
See application file for complete search history.

(56) References Cited

U.S. PATENT DOCUMENTS

| 5,559,656 A | 9/1996 | Chokhawala |
| 7,006,960 B2 | 2/2006 | Schaumont et al. |

(Continued)

FOREIGN PATENT DOCUMENTS

CN    103886146    6/2014

OTHER PUBLICATIONS

Chen et al.; "*A Systematic Approach to Modeling Impedances and Current Distribution in Planar Magnetics*"; IEEE Transactions on Power Electronics (20 pages), Jun. 22-25, 2014.
(Continued)

*Primary Examiner* — Emily P Pham
(74) *Attorney, Agent, or Firm* — Snell & Wilmer LLP

(57) ABSTRACT

Bridge circuits provide a reduced amplitude of gate-source voltage oscillation when the switches switch states during short circuit triggered turnoff for protection. Bridge circuits reduce an amplitude of an oscillation voltage between a gate and a source of a transistor that is utilized as a switch in the bridge circuit. This is beneficial because the reduced amplitude reduces the likelihood of damage to the transistor. A bridge circuit includes a first power rail and a second power rail. The bridge circuit further includes a first circuit having a first switch and a second switch connected in parallel between the first power rail and the second power rail. The bridge circuit further includes at least one passive circuit element connected in parallel with a primary energy flow path of the first circuit to damp oscillation voltage of the first circuit.

17 Claims, 5 Drawing Sheets

(51) Int. Cl.
*H03K 17/082* (2006.01)
*H03K 17/16* (2006.01)
*H02M 1/088* (2006.01)
*H02M 1/34* (2007.01)
*H02M 1/00* (2006.01)

(52) U.S. Cl.
CPC ..... *H03K 17/0822* (2013.01); *H03K 17/0828* (2013.01); *H03K 17/165* (2013.01); *H03K 17/168* (2013.01); *H02M 2001/0054* (2013.01); *H02M 2001/348* (2013.01)

(56) References Cited

U.S. PATENT DOCUMENTS

| | | | | |
|---|---|---|---|---|
| 7,969,225 | B2* | 6/2011 | Ho | H03K 17/567 327/110 |
| 8,611,115 | B2* | 12/2013 | Figge | H02M 3/3382 363/21.02 |
| 8,930,874 | B2 | 1/2015 | Duff et al. | |
| 9,251,460 | B2 | 2/2016 | Cantin et al. | |
| 9,400,861 | B2 | 7/2016 | Shepherd et al. | |
| 9,450,517 | B2* | 9/2016 | Kusama | H02M 7/537 |
| 2007/0279821 | A1* | 12/2007 | Sells | H02H 7/1255 361/98 |
| 2010/0060340 | A1* | 3/2010 | Hester | H03K 17/164 327/401 |
| 2013/0162322 | A1* | 6/2013 | Tao | H03K 17/04123 327/381 |
| 2015/0326145 | A1* | 11/2015 | Karlsson | H02M 7/5387 363/98 |
| 2016/0253445 | A1 | 9/2016 | Pataky | |
| 2016/0357895 | A1 | 12/2016 | Hyde et al. | |

OTHER PUBLICATIONS

Colmenares et al.; "*Dual-Function Gate Driver for a Power Module with SiC Junction Field-Effect Transistors*"; IEEE Transactions on Power Electronics, vol. 29, No. 5, May 2014 (13 pages).

McCulley, Matthew C.; "*Design, simulation, and preliminary testing of a 20 ampere energy management system*"; Naval Postgraduate School Thesis, Jun. 2015 (80 pages).

Niyomsatian et al.; "*A Novel Design Method for Half-Bridge Converters with High-Order Actively-Damped Filters*"; IEEE 2016 (8 pages).

Rumyancev et al.; "*Cascode class-E power amplifier in 180/350 nm CMOS for EER system*"; IEEE 2013 (4 pages).

Bendik Nybakk Torsaeter; "*Evaluation of Switching Characteristics Switching Losses and Snubber Design for a Full SiC Half-Bridge Power Module*"; Norwegian University of Science and Technology Department of Electric Power Engineering, Jun. 2016 (202 pages).

Yin et al.; "*The Design of EMI and EMC Based on Optical Burst-module PCB*"; IEEE 2008 (4 pages).

* cited by examiner

USE OF ADDITIONAL RESISTANCES AND CAPACITANCES BY OPTIMIZATION TO SOLVE GATE VOLTAGE OSCILLATION DURING SHORT CIRCUIT TURN-OFF PROTECTION FOR A SEMICONDUCTOR SWITCH

BACKGROUND

1. Field

The present disclosure relates to systems and methods for decreasing an oscillating voltage over switches of a bridge circuit when the switches change states.

2. Description of the Related Art

A bridge circuit is a circuit that includes a positive rail and a negative rail, which are usually oriented in parallel with each other, as well as an output rail located between the positive rail and the negative rail. Bridge circuits may be used to perform various functions such as modifying a voltage ratio between an input and an output, controlling power during a transfer, or providing controlled current to an output load. A short circuit protection mechanism is equipped with the gate driver to protect switches that compose the bridge circuits.

Conventional bridge circuits may experience a resonant loop effect when the corresponding switches are switched from an on state to an off state during a short circuit triggered turnoff. A resonant loop effect causes current within the circuit to resonate throughout the circuit until dissipated. The resonating current may cause gate-source voltage oscillation (i.e., oscillation of a voltage measured between a gate and a source of a transistor). The amplitude of the voltage oscillation may be relatively great, potentially exceeding the voltage limit of the transistor and damaging or destroying the gate of the transistor.

Previous attempts to reduce such overvoltages include increasing resistances between a driving voltage source and a gate of a transistor. While these increased resistances do reduce or dampen the amplitude of the gate-source oscillation voltages, they come with disadvantages. In particular, the increased resistances increase switching time of the transistor and are relatively bulky due to the relatively large resistances that are required to provide the requisite damping.

Accordingly, it is desirable to develop a bridge circuit that has gate-source oscillation voltage of a relatively low magnitude without materially affecting the switching time of the transistor.

SUMMARY

Described herein is a bridge circuit. The circuit includes a first power rail and a second power rail. The bridge circuit further includes a first circuit having a first switch and a second switch connected in parallel between the first power rail and the second power rail. The bridge circuit further includes at least one passive circuit element connected in parallel with a primary energy flow path of the first circuit to damp oscillation voltage of the first circuit.

Also described is a bridge circuit. The bridge circuit includes a first power rail, an output rail, and a second power rail. The bridge circuit further includes a first circuit having a first switch and a second switch connected in parallel between the first power rail and the output rail. The bridge circuit further includes a second circuit having a third switch and a fourth switch connected in parallel between the output rail and the second power rail. The bridge circuit further includes at least one passive circuit element connected in parallel with a primary energy flow path of the first circuit or the second circuit to damp oscillation voltage of the first circuit or the second circuit.

Also described is a method for optimizing an electrical circuit. The method includes defining, by a modeling controller, a model of the electrical circuit. The method further includes providing, to the modeling controller, a plurality of design variables. The method further includes providing, to the modeling controller, an objective function corresponding to a desired performance of the electrical circuit. The method further includes iteratively selecting, by the modeling controller, different combinations of design variables from the plurality of design variables. The method further includes determining, by the modeling controller, whether a specific combination of design variables satisfies the objective function.

BRIEF DESCRIPTION OF THE DRAWINGS

Other systems, methods, features, and advantages of the present invention will be or will become apparent to one of ordinary skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

The present disclosure describes bridge circuits that provide a reduced amplitude of gate-source voltage oscillation when the switches switch states during short circuit triggered turnoff for protection. Gate-source voltage oscillation refers to oscillation of voltage as measured across a gate and a source of a transistor. The bridge circuits described herein provide several benefits and advantages over conventional bridge circuits. In particular, the bridge circuits reduce an amplitude of an oscillation voltage between a gate and a source of a transistor that is utilized as a switch in the bridge circuit. This is beneficial because the reduced amplitude reduces the likelihood of damage to the transistor.

Furthermore, the bridge circuits described herein experience little to no additional switching loss and little to no reduction in switching speed, thus allowing the bridge circuits to operate at a relatively fast rate. This is advantageous because the bridge circuits are designed to quickly act in response to a short circuit condition in order to protect connected components, thus a relatively long delay in switching speed may damage the connected components. The newly-added components to the circuits are relatively small, allowing the improvements to be installed on an existing product without significant modification of the product.

An exemplary bridge circuit includes a first power rail, a second power rail, and an output power rail. The bridge circuit further includes a first circuit connected between the first power rail and the output power rail, and a second circuit connected between the output power rail and the second power rail. The first circuit and the second circuit each include two or more switches, such as transistors, connected in parallel with each other. When the switches are closed, the current flows between the first power rail and the output power rail via the first circuit, and between the output power rail and the second power rail via the second circuit. The bridge circuit further includes one or more passive circuit element, such as a resistor or a capacitor, in parallel with the primary flow path of the current. This one or more passive circuit element damps the oscillation voltage while not significantly slowing down the switching speed of the transistors. The one or more passive circuit element excludes parasitic features, such as parasitic inductance, of the components of the bridge circuit.

Figure 1:
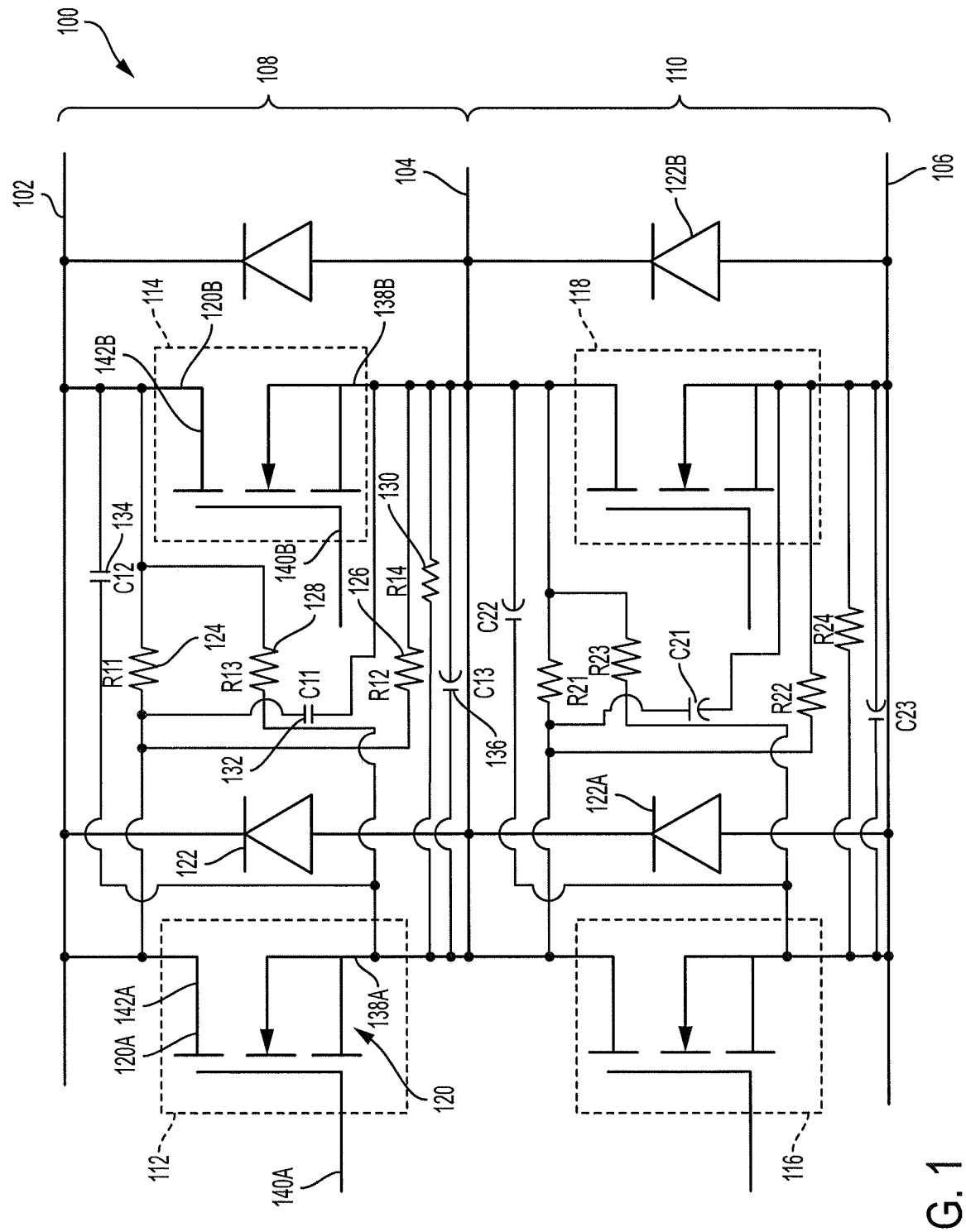
FIG. 1 is a drawing illustrating an exemplary bridge circuit that includes metal oxide field-effect transistor (MOSFET) switches and passive circuit elements in parallel a primary energy flow path of the bridge circuit according to an embodiment of the present invention.

Referring now to FIG. 1, a bridge circuit 100 is shown. The bridge circuit 100 includes a first power rail 102, an output rail 104, and a second power rail 106. The bridge circuit 100 further includes a first circuit 108 connected between the first power rail 102 and the output rail 104. The bridge circuit 100 further includes a second circuit 110 connected between the output rail 104 and the second power rail 106. The first circuit 108 includes a first switch 112 and a second switch 114. The second circuit 110 includes a third switch 116 and a fourth switch 118.

Each of the switches 112, 114, 116, 118 may include a transistor 120. The transistor 120 may include any type of transistor such as a bipolar junction transistor (BJT), a junction gate field-effect transistor (JFET), a metal-oxide-semiconductor field-effect transistor (MOSFET), an insulated-gate bipolar transistor (IGBT), or the like. In some embodiments, each of the switches 112, 114, 116, 118 may also or instead include any other element capable of switching between a conducting state and a non-conducting state. For example, a switch may include one or more of a TRIode AC (TRIAC), a DIode AC switch (DIAC), a thyristor (such as a gate turn-off thyristor), a transistor, or the like.

Discussion regarding operation of the first circuit 108 is equally applicable to the second circuit 110. The bridge circuit 100 may be equipped with short circuit protection function in the gate drivers. In that regard, when a short-circuit occurs in a connected circuit element the switches may turn off, stopping an incoming rush of current to prevent damage to the switches on the first and second circuits.

When the first switch 112 and the second switch 114 are turned "off" most electrical power remains on the parasitic elements of the corresponding energy path. For example, the current that is received on the first power rail 102 remains on the parasitic elements of the corresponding energy path and substantially fails to travel through the first circuit 108, but instead travels through the resonant loop between parallel switches and resides in the first circuit 108.

When the first switch 112 and the second switch 114 are turned "on" electrical power may flow through the switches 112, 114 to the output rail 104. In that regard, current from the first power rail 102 may flow from the first power rail 102 through the switches 112, 114 to the output rail 104.

The transistors 120 shown in FIG. 1 are N-channel MOSFETs. The first circuit 108 includes a first transistor 120A and a second transistor 120B. Each of the transistors 120A, 120B include a drain 142A, 142B, a source 138A, 138B, and a gate 140A, 140B, respectively.

In some embodiments, the bridge circuit 100 may further include one or more diode 122 associated with each circuit 108, 110. For example, the second circuit 110 includes a first diode 122A and a second diode 122B.

The switches 112, 114 may be switched between an "on," or conducting state and an "off," or non-conducting state, by controlling the voltage at the gates 140A, 140B of the corresponding transistor 120A, 120B. For example, the switch 112 may be turned "on" or "off" by applying a voltage that is greater than a threshold voltage of the switch 112 at the gate 140A of the first transistor 120A, and may be switched to the other of "on" or "off" by removing the voltage from the gate 140A.

Conventional bridge circuits may experience a resonant loop effect in certain situations. For example, the switches may be switched off during a short circuit situation in order to protect the circuit, thus resulting in a gate voltage oscillation which may result in an overvoltage. Such overvoltage may undesirably exceed the voltage limit of the gate of the transistor and damage or destroy the gate of the transistor.

This issue has previously been addressed by adding resistance or inductance between a driver and a gate of transistor switches. While inclusion of such resistance or inductance dampens the voltage oscillation, such resistance or inductance also provides undesirable effects such as reduced speed of transistor driving, increased switching loss, and inclusion of relatively bulky circuit components.

In order to reduce the likelihood of voltage spikes due to oscillation voltage from a resonant loop within the bridge circuit 100, one or more passive circuit element may be connected in parallel with the primary energy flow path of the bridge circuit 100 (i.e., in parallel with the current flowing from the first power rail 102 through the switches 112, 114 to the output rail 104). In some embodiments, the first circuit 108 may include one passive circuit element and, in some embodiments, the first circuit 108 may include multiple passive circuit elements.

Addition of the passive circuit elements connected in parallel to the primary energy flow path provides several advantages. For example, the passive circuit elements reduce the magnitude of the oscillation voltage without slowing operation of the switch and without incurring additional loss. Additionally, the passive circuit elements may be added to an existing circuit without modifying the circuit due to the relatively small footprint of the passive circuit elements. An optimization routine may be run using one or more objective functions to determine whether an additional resistance and/or an additional capacitance may be included to further improve performance of the switch. For example, the one or more objective functions may include decreasing switching loss, reducing the root-mean-square (RMS) voltage overshoot value, or decreasing temperature rise during a short-circuit fall situation.

The first circuit 108 and the second circuit 110 each include multiple resistors and multiple capacitors oriented in parallel with the primary energy flow path of the bridge circuit 100. The specific resistors and capacitors, and their locations within the circuit, reduce the amplitude of the gate-source oscillation voltage. In particular, the first circuit 108 includes the following passive circuit elements:

a first resistor 124 ($R_{11}$) connected between the drain 142A of the first transistor 120A and the drain 142B of the second transistor 120B;

a second resistor 126 ($R_{12}$) connected between the drain 142A of the first transistor 120A and the source 138B of the second transistor 120B;

a third resistor 128 ($R_{13}$) connected between the source 138A of the first transistor 120A and the drain 142B of the second transistor 120B;

a fourth resistor 130 ($R_{14}$) connected between the source 138A of the first transistor 120A and the source 138B of the second transistor 120B;

a first capacitor 132 ($C_{11}$) connected between the drain 142A of the first transistor 120A and the source 138B of the second transistor 120B;

a second capacitor 134 ($C_{12}$) connected between the source 138A of the first transistor 120A and the drain 142B of the second transistor 120B; and a third capacitor 136 ($C_{13}$) connected between the source 138A of the first transistor 120A and the source 138B of the second transistor 120B.

The second circuit 110 may include similar resistors and capacitors connected to the same respective locations as the resistors and capacitors of the first circuit 108. In some embodiments, only the first circuit 108 or the second circuit 110 may include such passive circuit elements. In some embodiments, the first circuit 108 may include different passive circuit elements or the same passive circuit elements oriented differently than the second circuit 110.

In some embodiments, the bridge circuit 100 may be configured in multiple ways. In a first configuration, power may be received on the first power rail 102 and the second power rail 106, and an output may be provided on the output power rail 104 and the second power rail 106. In a second configuration, power may be received on the output power rail 104 and the second power rail 106, and an output may be provided on the first power rail 102 and the second power rail 106.

Figure 2:
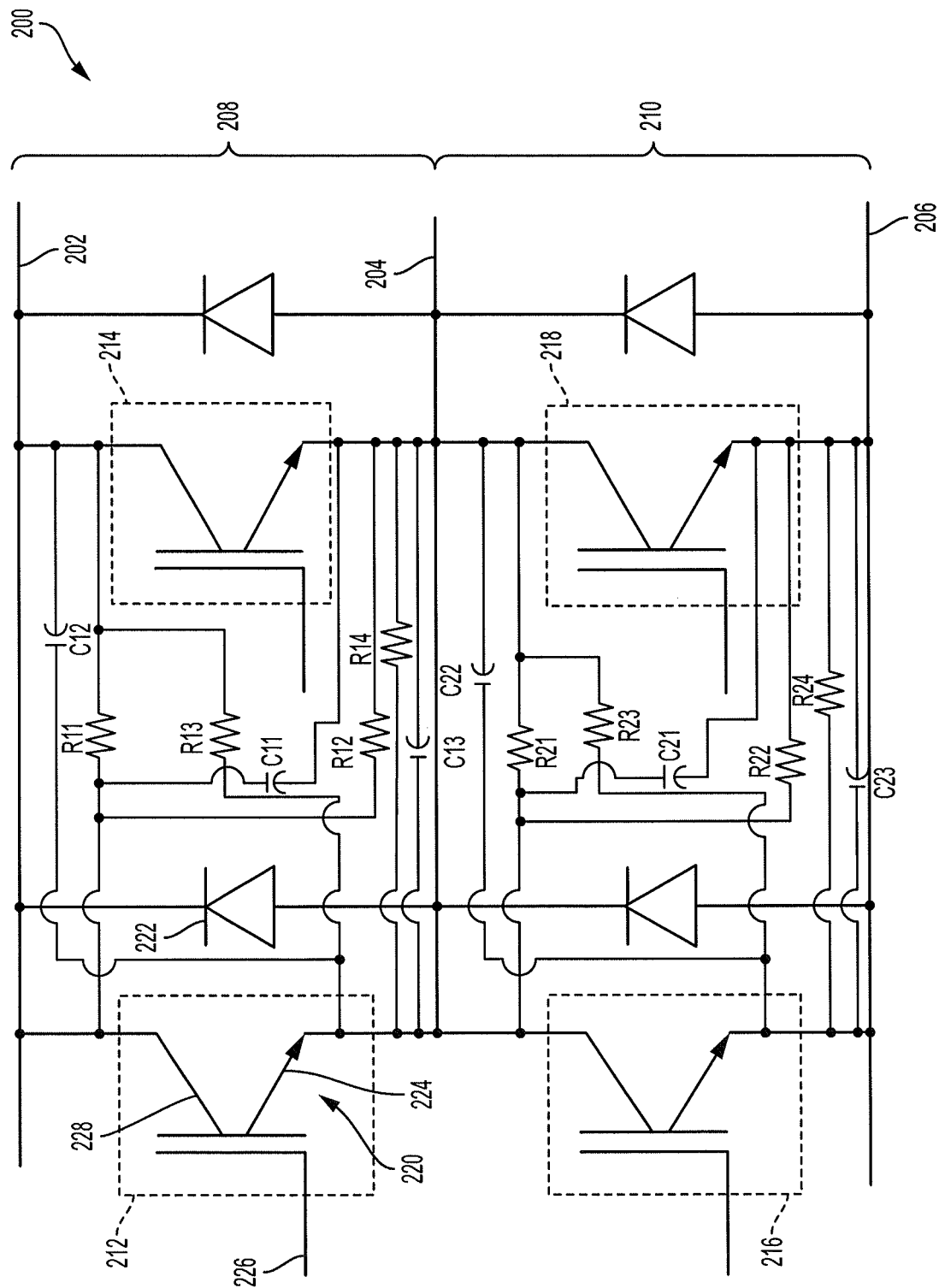
FIG. 2 is a drawing illustrating an exemplary bridge circuit that includes insulated gate bipolar transistor (IGBT) switches and passive circuit elements in parallel with a primary energy flow path of the bridge circuit according to an embodiment of the present invention.

Referring now to FIG. 2, another bridge circuit 200 includes a first power rail 202, an output rail 204, and a second power rail 206. A first circuit 208 is connected between the first power rail 202 and the output rail 204. A second circuit 210 is connected between the output rail 204 and the second power rail 206. The first circuit 208 may include a first switch 212 and a second switch 214, and the second circuit 210 may include a third switch 216 and a fourth switch 218.

Referring to FIGS. 1 and 2, the first circuit 208 and the second circuit 210 may include similar components as the first circuit 108 and the second circuit 110. However, each of the switches 212, 214, 216, 218 may include a N-channel IGBT transistor 220 instead of a MOSFET. In that regard, the resistors and the capacitors of the bridge circuit 200 may be connected in a similar manner as the resistors and capacitors of the bridge circuit 100. A minor difference may exist in that the circuit elements connected to the drains 142 of the MOSFET transistors 120 may instead be connected to a collector 228 of the IGBT transistors 220, the circuit elements connected to the sources 138 of the MOSFET transistors 120 may instead be connected to an emitter 224 of the IGBT transistors 220, and the IGBT transistors 220 may be controlled via a base 226 instead of the gates 140.

Figure 3:
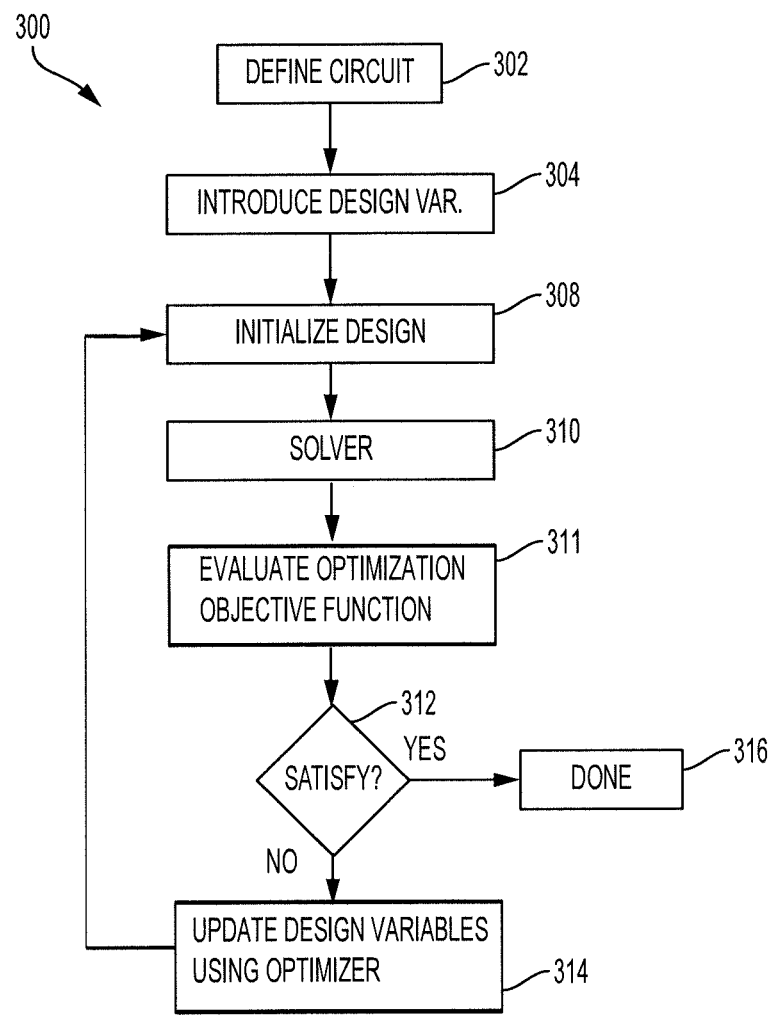
FIG. 3A is a block diagram illustrating a modeling or simulation computer for optimizing selection of passive circuit elements according to an embodiment of the present invention.
FIG. 3B is a flowchart illustrating a method for optimizing selection of passive circuit elements to include in a bridge circuit to reduce an amplitude of gate-source oscillation voltages according to an embodiment of the present invention.

Referring now to FIGS. 3A and 3B, a computational method 300 may be performed by a modeling or simulation computer 350 having a modeling controller 352 and a modeling memory 354. The modeling memory 354 may include a non-transitory memory configured to store data as requested by, along with instructions to be performed by, the corresponding modeling or simulation controller or processor 352. The modeling controller 352 may be designed to perform modeling and simulation of various circuits and may include one or more controller or processor capable of performing such modeling functions.

Referring to FIG. 3B, the method 300 may be performed to determine optimal passive circuit elements and locations to connect such passive circuit elements to a bridge circuit. The method 300 may also or instead be used to solve alternative electronics hardware problems such as locations of diodes in a surge protector to reduce the likelihood of a large amplitude pulse damaging components of the surge protector or the like.

In block 302, the bridge circuit (or other electronic circuit) may be defined. For example, the bridge circuit 100 of FIG. 1 may be defined in modeling software such as Matlab®, Simulink®, PSpice®, or the like.

In block 304, design variables may be introduced for optimization. The design variables may include the type of passive circuit elements to be included (i.e., capacitors and resistors), the value of such passive circuit elements (i.e., the resistance of resistors and the capacitance of capacitors), the potential connection locations of the passive circuit elements, a maximum quantity of passive circuit elements, or the like. All potential design variables may be introduced in block 304.

In some embodiments, an objective function may be provided in block 304. The objective function corresponds to a desired result of the defined circuit. For example, the objective function may include the desire to reduce the gate voltage oscillation due to the resonant loop effect.

In block 308, the design of the circuit may be initialized. For example, the circuit and the design variables may be initialized using the modeling software. For example, during each iteration of block 308, different design variables from the total list provided in block 306 may be introduced. For example, during a first iteration of block 308, one resistor having a resistance of 10 kilo ohms may be introduced between location A and location B. During a second iteration, the same resistor may be moved to a new location between location B and location C. During a third iteration, the resistor may stay in its previous location and a capacitor may be introduced between location A and location B.

In block 310, a solver may be initialized to evaluate the characteristics of the circuit with the design variables that were introduced in block 308 with the initialization of the design. For example, the solver may include PSpice®, LTSpice®, or the like.

In block 311, optimization of the objective function may be evaluated. The results from block 310 may be passed to block 311 for further calculation or data processing. In particular, the optimizer may evaluate the objective function based on the results of the solved circuit from block 310. The optimizer may include a custom optimization script prepared in Matlab®.

After the solver has completed and the objective functions evaluated in block 311, the method 300 may include determining whether the objective functions have been satisfied in block 312. If the objective functions have been satisfied then the method 300 may be deemed completed in block 316. Otherwise, the method may proceed to block 314. In some embodiments, satisfaction of the objective functions includes minimization of the RMS value below a certain RMS voltage threshold.

In block 314, the design variables may be updated using the optimizer. After the objective function has been deemed to be unsatisfied, the optimization routine may also initialize and assign default values to the circuit that is defined in block 302. The electrical performance indices are simulated using the solver and provided to the optimization routine, as necessary, for updating of design variables. The optimization routine may calculate and update the design variables based on a specific evolutionary optimization algorithm, a genetic algorithm, or similar algorithm using a possible numerical method, as a non-limiting example.

After block 314 is complete, the method 300 may return to block 308, where the design is again initialized.

Figure 4:
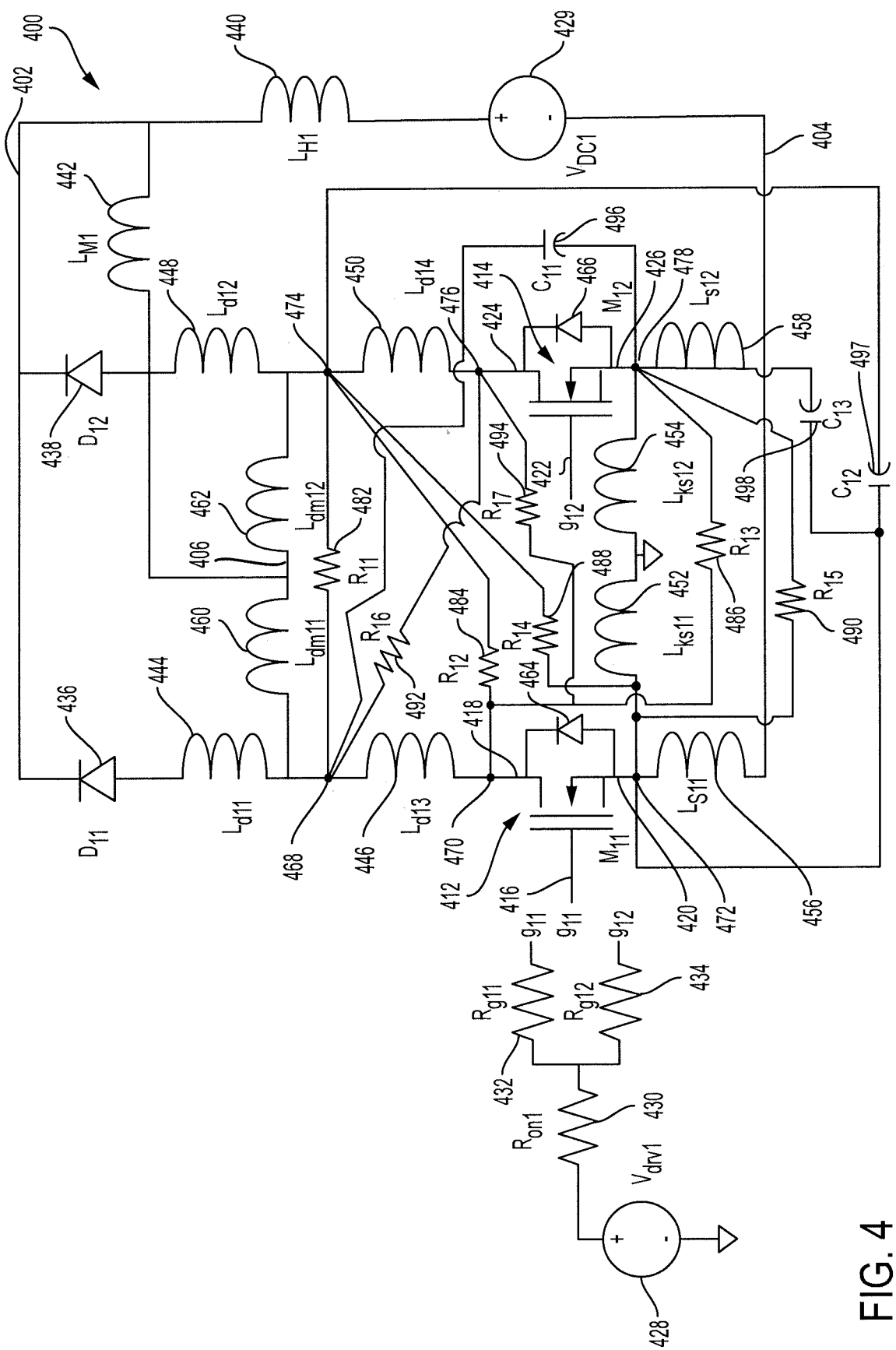
FIG. 4 is a drawing illustrating a double pulse tester circuit that includes passive circuit elements in parallel with a primary energy flow path of the double pulse tester circuit in order to quantify decreased amplitude of gate-source oscillation voltages due to use of the passive circuit elements, the passive circuit elements being selected using the method of FIG. 3B, according to an embodiment of the present invention.

Referring now to FIG. 4, a double pulse tester circuit 400, which may be designed as a double pulse tester, includes passive circuit elements that have been selected using the method 300 of FIG. 3B. The double pulse tester circuit 400 includes a first power rail 402, a second power rail 404, and an output bus 406.

The double pulse tester circuit 400 includes a first transistor 412 and a second transistor 414. The first transistor 412 has a gate 416, a drain 418, and a source 420. The second transistor 414 includes a gate 422, a drain 424, and a source 426.

The double pulse tester circuit 400 includes a driving power source 428 that controls switching of the double pulse tester circuit 400. The driving power source 428 may output 20 volts (20 V). The driving power source 428 may be turned on at a time of 0 seconds and may remain on for 90 µs during which time the current may reach 750 amps. After 90 µs the driving power source 428 may be instantly turned off to mimic short circuit triggered protection.

The voltage output by the driving power source 428 passes through an on resistor 430 (having a value of 5 ohms) and split between a first gate resistor 432 and a second gate resistor 434 (each having a value of 5 ohms). Conventional approaches for reducing overvoltage due to the resonant loop effect include increasing the values of the first gate resistor 432 and the second gate resistor 434. However, such increases slow the gate switching speed of the transistors 412, 414.

The output of the first gate resistor 432 is provided to the gate 416 of the first transistor 412, and the output of the second gate resistor 434 is provided to the gate 422 of the second transistor 414 for driving the transistors 412, 414.

The double pulse tester circuit 400 further includes a DC power source 429. The DC power source 429 may simulate power input applied to the double pulse tester circuit 400. The DC power source 429 may output a DC value of 600 V.

The double pulse tester circuit 400 further includes a first diode 436 and a second diode 438.

Various inductors are shown throughout the double pulse tester circuit 400. The inductors represent parasitic inductance of the wires or lines of the double pulse tester circuit 400 and may not include physical inductors.

In particular, the double pulse tester circuit 400 may include a bus inductance 440 having a value of 50 nano-Henry (nH) and an output inductance 442 having a value of 20 µH. A first diode inductance 444 (corresponding to an anode of the first diode 436) and a first drain inductance 446 correspond to the connections between the first diode 436 and the drain 418 of the first transistor 412, and a second diode inductance 448 and a second drain inductance 450 correspond to the connections between the second diode 438 and the drain 424 of the second transistor 414. The first diode inductance 444 and the second diode inductance 448 may each have a value of 2 nH, and the first drain inductance 446 and the second drain inductance 450 may each have a value of 1 nH.

A first Kelvin source inductance 452 and a second Kelvin source inductance 454 may each have a value of 1 nH. A first source inductance 456 corresponds to the source 420 of the first transistor 412 and may have a value of 2 nH. A second source inductance 458 corresponds to the source 426 of the second transistor 414 and may have a value of 1 nH.

A first bus inductance 460 corresponds to inductance of the output bus 406, and a second bus inductance 462 corresponds to additional inductance of the output bus 406. The first bus inductance 460 and the second bus inductance 462 may each have a value of 1 nH.

A first transistor diode 464 may be an internal diode to the first transistor 412 and connected between the source 420 and the drain 418 of the first transistor 412, and a second transistor diode 466 may be an internal diode to the second transistor 414 and connected between the source 426 and the drain 424 of the second transistor 414.

A modeling controller performing the method 300 of FIG. 3B may be provided with the double pulse tester circuit 400 (without the passive circuit elements but including the parasitic inductances), the design variables including passive circuit elements in parallel with the primary energy flow path, and the objective function to reduce gate-source oscillation voltage. The modeling controller may further be provided with six nodes 468, 470, 472, 474, 476, 480 which are preselected for connecting the passive circuit elements. The method 300 of FIG. 3B may utilize this received data and perform the solver and optimization routine to determine optimal passive circuit elements and optimal locations for connecting such circuit elements.

The optimization routine (for example, a genetic algorithm optimization routine) of the method 300 of FIG. 3B may be provided with a population set at 20, a tournament size of 2, an elite count of 2, an immigration count of 3, a crossover fraction of 0.5, a mutation rate of 0.07, and a number of generations equal to or greater than 4. The fitness function may be defined as the average of the absolute value of the voltage between the gate and the source of a respective transistor (gate-source voltage). The absolute value may be used in order to avoid the situation of a relatively large oscillation swing between positive and negative values yielding a relatively small average gate-source voltage.

The method 300 determined that the specific passive elements that are connected to the specific nodes illustrated in FIG. 4 provide an optimal reduction in gate oscillation voltage. Such reduction is provided as the passive circuit elements provide additional damping paths to reduce voltage oscillation during a turnoff transient.

In one embodiment, the double pulse tester circuit 400 includes seven resistors and three capacitors. Resistance of the resistors used in the double pulse tester circuit 400 is 10 ohms, and the capacitance of the capacitors used in the double pulse tester circuit 400 is 10 nanoFarads. However, the values of the resistors and capacitors may be further optimized to improve results.

In particular, the double pulse tester circuit 400 includes a first resistor 482 connected between the node 468 and the node 474. Stated differently, the first resistor 482 may be connected to a point between the first diode inductance 444 and the first drain inductance 446, and to a point between the second diode inductance 448 and the second drain inductance 450.

The double pulse tester circuit 400 further includes the following passive circuit elements:
  a second resistor 484 connected between the node 470 and the node 474;
  a third resistor 486 connected between the node 470 and the node 478;
  a fourth resistor 488 connected between the node 472 and the node 474;
  a fifth resistor 490 connected between the node 472 and the node 478;
  a sixth resistor 492 connected between the node 468 and the node 476;
  a seventh resistor 494 connected between the node 470 and the node 476;
  a first capacitor 496 connected between the node 468 and the node 478;
  a second capacitor 497 connected between the node 472 and the node 474; and
  a third capacitor 498 connected between the node 472 and the node 478.

Figure 5B:
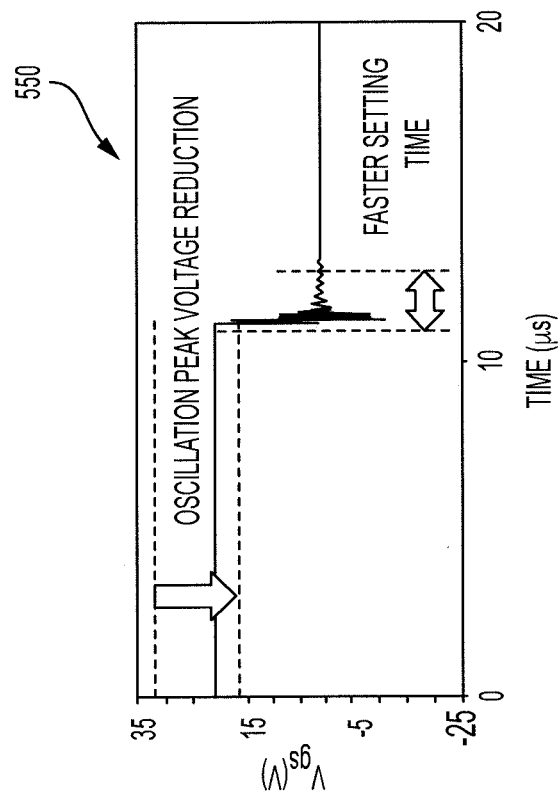
FIG. 5B is a graph illustrating gate-source oscillation voltages of the double pulse tester circuit of FIG. 4 according to an embodiment of the present invention.
Figure 5A:
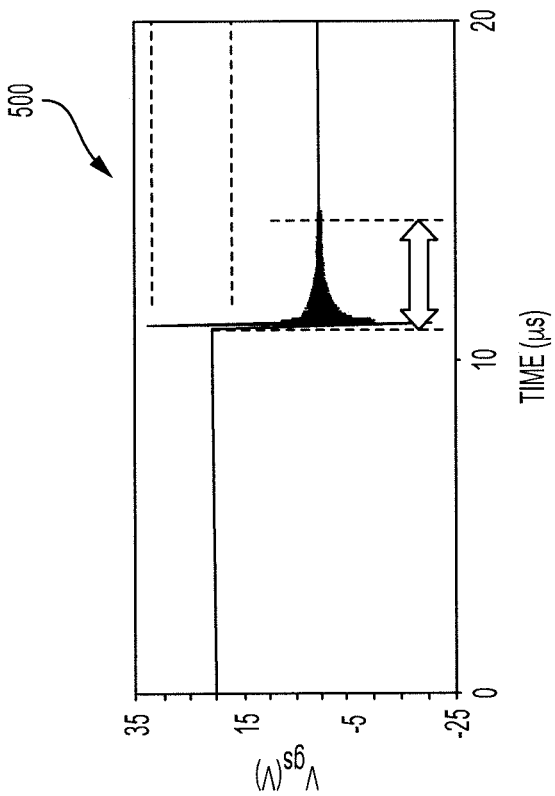
FIG. 5A is a graph illustrating gate-source oscillation voltages of a double pulse tester circuit that fails to include passive circuit elements in parallel with a primary energy flow path according to an embodiment of the present invention.

Referring to FIGS. 4, 5A, and 5B, a plot 500 illustrates the gate-source voltage of the first transistor 412 over time when the double pulse tester circuit 400 includes no passive circuit elements. A plot 550 illustrates the gate-source voltage of the first transistor 412 over time when the passive circuit elements are included in the double pulse tester circuit 400.

As shown in the plot 500, the gate-source voltage without the passive circuit elements reaches a peak of 32.3 V during the turn-off transient due to the voltage oscillation caused by the resonant loop effect. The voltage of 32.3 V is greater than the maximum rated gate-source voltage of the first transistor 412 which may potentially damage the first transistor 412 and is unacceptable in circuit operation.

As shown in the plot 550, inclusion of the resistors and capacitors in the double pulse tester circuit 400 of FIG. 4 significantly reduces the peak voltage during the turn-off transient. In particular, the peak voltage in the plot 550 is less than 20 V, which is the driving voltage of the driving power source 428. Inclusion of the resistors and capacitors provides an additional advantage of reducing the amount of time in which the voltage resonates during the turnoff transient.

The resistors and capacitors utilized in the double pulse tester circuit 400 have a relatively small footprint and volume, and are also relatively inexpensive and robust.

Accordingly, the resistors and capacitors may be directly added inside a power module without modifying the conducting substrates of the power module.

Where used throughout the specification and the claims, "at least one of A or B" includes "A" only, "B" only, or "A and B." Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A bridge circuit comprising:
  a first power rail;
  a second power rail;
  a first circuit having a first switch and a second switch connected in parallel between the first power rail and the second power rail;
  at least one passive circuit element connected in parallel with a primary energy flow path of the first circuit to damp oscillation voltage of the first circuit;
  an output rail;
  a second circuit having a third switch and a fourth switch connected in parallel between the first power rail and the second power rail; and
  at least a second passive circuit element connected in parallel with a primary energy flow path of the second circuit to damp oscillation voltage of the second circuit.

2. The bridge circuit of claim 1 wherein each of the first switch and the second switch include a transistor.

3. The bridge circuit of claim 2 wherein the at least one passive circuit element includes at least one of:
  a first resistor connected between an emitter or a source of the transistor of the first switch and the emitter or the source of the transistor of the second switch;
  a second resistor connected between the emitter or the source of the transistor of the first switch and a collector or a drain of the transistor of the second switch;
  a third resistor connected between the collector or the drain of the transistor of the first switch and the collector or the drain of the transistor of the second switch;
  a first capacitor connected between the emitter or the source of the transistor of the first switch and the collector or the drain of the transistor of the second switch; or
  a second capacitor connected between the collector or the drain of the transistor of the first switch and the collector or the drain of the transistor of the second switch.

4. The bridge circuit of claim 3 wherein the at least one passive circuit element includes the first resistor, the second resistor, the third resistor, the first capacitor, and the second capacitor.

5. The bridge circuit of claim 1 wherein the first circuit provides short-circuit turn-off protection.

6. A bridge circuit comprising:
  a first power rail;
  a second power rail;
  a first circuit having a first switch and a second switch connected in parallel between the first power rail and the second power rail; and at least one resistor or capacitor connected in parallel with a primary energy flow path of the first circuit to damp oscillation voltage of the first circuit, the at least one resistor or capacitor including at least one of:
- a first resistor connected between an emitter or a source of the transistor of the first switch and the emitter or the source of the transistor of the second switch,
- a second resistor connected between the emitter or the source of the transistor of the first switch and a collector or a drain of the transistor of the second switch,
- a third resistor connected between the collector or the drain of the transistor of the first switch and the collector or the drain of the transistor of the second switch,
- a first capacitor connected between the emitter or the source of the transistor of the first switch and the collector or the drain of the transistor of the second switch, or
- a second capacitor connected between the collector or the drain of the transistor of the first switch and the collector or the drain of the transistor of the second switch.

7. The bridge circuit of claim 6 wherein each of the first switch and the second switch include a transistor.

8. The bridge circuit of claim 6 wherein the at least one resistor or capacitor includes the first resistor, the second resistor, the third resistor, the first capacitor, and the second capacitor.

9. The bridge circuit of claim 6 wherein the first circuit provides short-circuit turn-off protection between the first power rail and the second power rail.

10. The bridge circuit of claim 6 further comprising:
- an output power rail;
- a second circuit having a third switch and a fourth switch connected in parallel between the first power rail and the second power rail; and
- at least a second resistor or capacitor connected in parallel with a primary energy flow path of the second circuit to damp oscillation voltage of the second circuit.

11. The bridge circuit of claim 10 wherein the first circuit is connected between the first power rail and the output power rail, and the second circuit is connected between the second power rail and the output power rail.

12. The bridge circuit of claim 11 wherein the first circuit and the second circuit include identical circuit elements.

13. The bridge circuit of claim 11 wherein at least one of:
- a first input is provided on the first power rail and the second power rail, and a first output is provided on the output power rail and the second power rail; or
- a second input is provided on the output power rail and the second power rail, and a second output is provided on the first power rail and the second power rail.

14. The bridge circuit of claim 11 wherein each of the first switch, the second switch, the third switch, and the fourth switch include a transistor.

15. The bridge circuit of claim 14 wherein the at least the second resistor or capacitor includes at least one of:
- a fourth resistor connected between an emitter or a source of the transistor of the third switch and the emitter or the source of the transistor of the fourth switch;
- a fifth resistor connected between the emitter or the source of the transistor of the third switch and a collector or a drain of the transistor of the fourth switch;
- a sixth resistor connected between the collector or the drain of the transistor of the third switch and the collector or the drain of the transistor of the fourth switch;
- a third capacitor connected between the emitter or the source of the transistor of the third switch and the collector or the drain of the transistor of the fourth switch; or
- a fourth capacitor connected between the collector or the drain of the transistor of the third switch and the collector or the drain of the transistor of the fourth switch.

16. A bridge circuit comprising:
- a first power rail;
- a second power rail;
- a first circuit having a first transistor and a second transistor both connected in parallel between the first power rail and the second power rail;
- at least one resistor, capacitor, or inductor connected in parallel with a primary energy flow path of the first circuit to damp oscillation voltage of the first circuit;
- an output rail;
- a second circuit having a third transistor and a fourth transistor connected in parallel between the first power rail and the second power rail; and
- at least a second resistor, capacitor, or inductor connected in parallel with a primary energy flow path of the second circuit to damp oscillation voltage of the second circuit.

17. The bridge circuit of claim 16 wherein the at least one resistor, capacitor, or inductor includes at least one of:
- a first resistor connected between an emitter or a source of the first transistor and the emitter or the source of the second transistor;
- a second resistor connected between the emitter or the source of the first transistor and a collector or a drain of the second transistor;
- a third resistor connected between the collector or the drain of the first transistor and the collector or the drain of the second transistor;
- a first capacitor connected between the emitter or the source of the first transistor and the collector or the drain of the second transistor; or
- a second capacitor connected between the collector or the drain of the first transistor and the collector or the drain of the second transistor.

* * * * *